(12) United States Patent
Karuppiah et al.

(10) Patent No.: US 12,092,701 B2
(45) Date of Patent: Sep. 17, 2024

(54) CONNECTOR SEATING DETECTION SYSTEM

(71) Applicant: Dell Products L.P., Round Rock, TX (US)

(72) Inventors: Kannan Karuppiah, Fremont, CA (US); Shree Rathinasamy, Round Rock, TX (US); Arunkumar Poosaithurai, Round Rock, TX (US)

(73) Assignee: Dell Products L.P., Round Rock, TX (US)

( * ) Notice: Subject to any disclaimer, the term of this patent is extended or adjusted under 35 U.S.C. 154(b) by 73 days.

(21) Appl. No.: 17/971,890

(22) Filed: Oct. 24, 2022

(65) Prior Publication Data

US 2024/0133976 A1 Apr. 25, 2024
US 2024/0230790 A9 Jul. 11, 2024

(51) Int. Cl.
*G01R 31/69* (2020.01)
*G01R 1/04* (2006.01)

(52) U.S. Cl.
CPC ........... *G01R 31/69* (2020.01); *G01R 1/0416* (2013.01)

(58) Field of Classification Search
CPC .......... G01R 1/02; G01R 1/04; G01R 1/0408; G01R 1/0416; G01R 31/50; G01R 31/66; G01R 31/68; G01R 31/69; G01R 31/70
See application file for complete search history.

(56) References Cited

U.S. PATENT DOCUMENTS

| | | | |
|---|---|---|---|
| 2006/0223380 A1* | 10/2006 | King | H01R 13/641 439/676 |
| 2011/0012727 A1* | 1/2011 | Pance | G06F 13/4068 340/505 |
| 2013/0017732 A1* | 1/2013 | Parke | H01R 13/641 439/660 |
| 2014/0016902 A1* | 1/2014 | Pepe | H01R 13/62 403/376 |
| 2014/0111236 A1* | 4/2014 | Schratz | G01R 1/0408 324/750.25 |
| 2014/0242829 A1* | 8/2014 | Brodsky | H01R 13/62 439/372 |
| 2015/0178173 A1* | 6/2015 | Brodsky | H05K 7/1492 710/16 |
| 2017/0162973 A1* | 6/2017 | Norton | H01R 13/641 |
| 2020/0132746 A1* | 4/2020 | Mullady | G01R 31/69 |

* cited by examiner

Primary Examiner — Huy Q Phan
Assistant Examiner — David B Frederiksen
(74) *Attorney, Agent, or Firm* — Joseph Mencher

(57) ABSTRACT

A connector seating detection system includes a device having a port that includes at least one port communication contact. A connector seating sensor is located adjacent the port. A connector seating detection subsystem is coupled to the connector seating sensor. When a connector is positioned in the port while not engaging at least one port communication contact by a threshold amount, the connector seating detection subsystem receives an unseated connector signal from the connector seating sensor and, in response, generates an unseated connector indication. When a connector is positioned in the port while engaging at least one port communication contact the threshold amount, the connector seating detection subsystem receives a seated connector signal from the connector seating sensor and, in response, generates a seated connector indication.

20 Claims, 11 Drawing Sheets

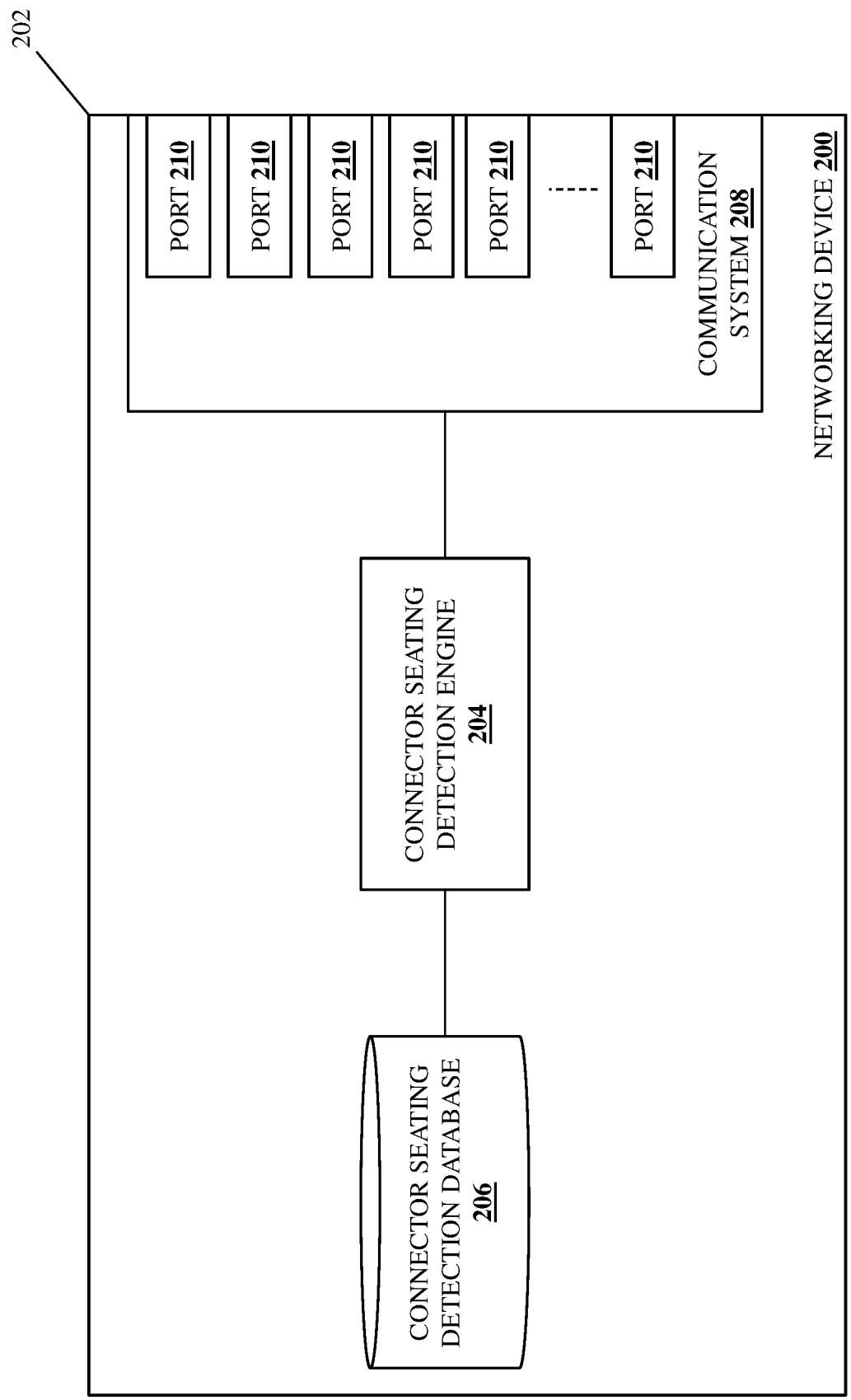

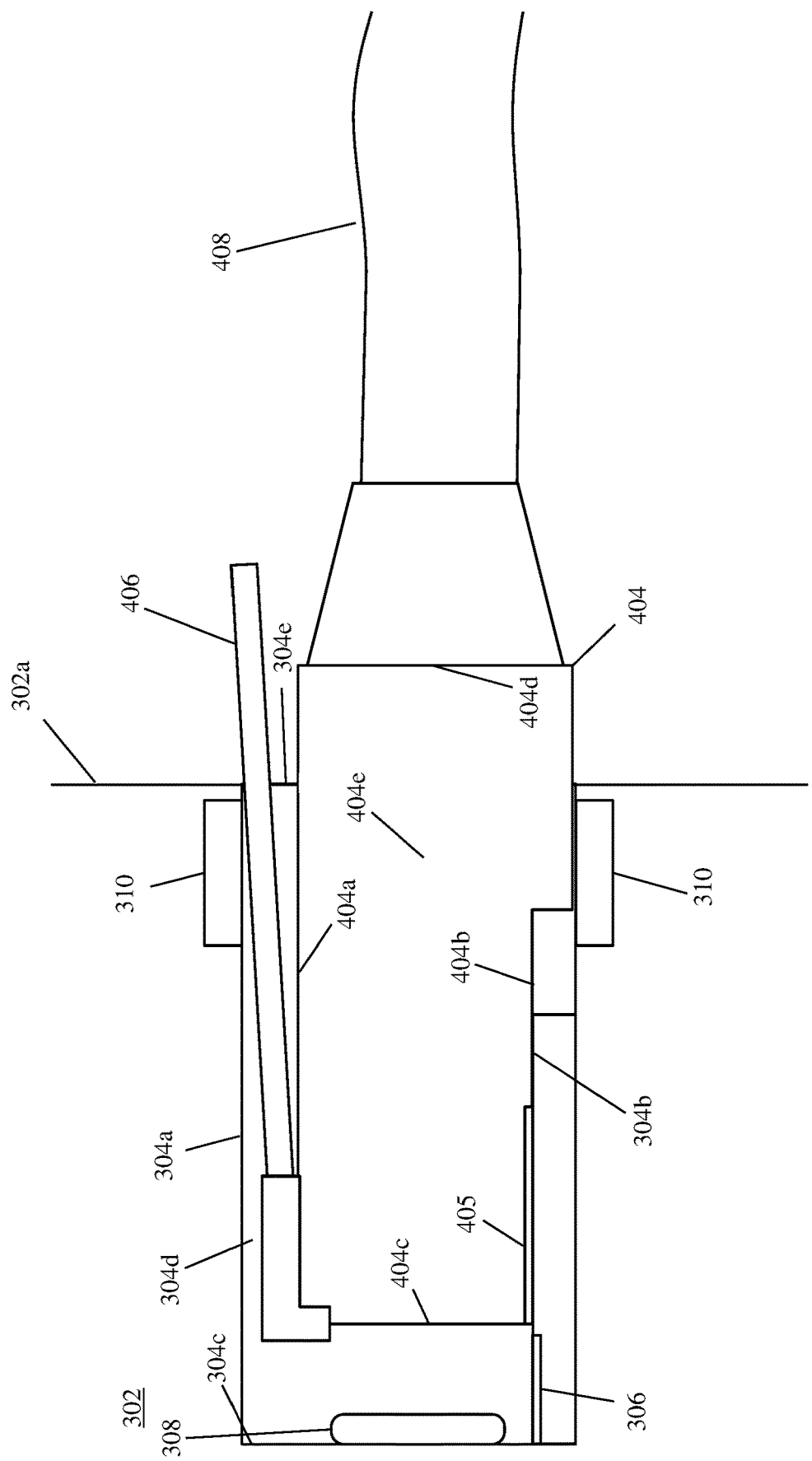

CONNECTOR SEATING DETECTION SYSTEM

BACKGROUND

The present disclosure relates generally to information handling systems, and more particularly to detecting whether a connector is properly seated in a port on an information handling system.

As the value and use of information continues to increase, individuals and businesses seek additional ways to process and store information. One option available to users is information handling systems. An information handling system generally processes, compiles, stores, and/or communicates information or data for business, personal, or other purposes thereby allowing users to take advantage of the value of the information. Because technology and information handling needs and requirements vary between different users or applications, information handling systems may also vary regarding what information is handled, how the information is handled, how much information is processed, stored, or communicated, and how quickly and efficiently the information may be processed, stored, or communicated. The variations in information handling systems allow for information handling systems to be general or configured for a specific user or specific use such as financial transaction processing, airline reservations, enterprise data storage, or global communications. In addition, information handling systems may include a variety of hardware and software components that may be configured to process, store, and communicate information and may include one or more computer systems, data storage systems, and networking systems.

Information handling systems such as, for example, networking devices (e.g., switch devices, router devices, and/or other networking devices known in the art), storage systems, server device, desktop computing device, laptop/notebook computing device, tablet computing devices, mobile phones, and/or other computing device known in the art, are utilized to communicate data between each other. For example, cables (e.g., Ethernet cables) may be coupled to ports (e.g., networking ports, console ports, management ports, etc.) on a plurality of devices via the engagement of connectors on the cable to respective ports on different devices, and then the devices may transmit data via that cable. However, the communication of data via cables coupled to ports on devices as discussed above can raise some issues.

As will be appreciated by one of skill in the art in possession of the present disclosure, the communication of data via the cables discussed above requires proper engagement of the connectors on the cable to the ports on the device. However, in some situations, a connector on the cable discussed above may not be properly seated in the port of the device, a latch on the connector that is configured to secure the connector to the port on the device may be broken such that the connector may become unseated/improperly seated in the port on the device, and/or the connector on the cable may otherwise not be properly engaged with the port on the device for other reasons that would be apparent to one of skill in the art in possession of the present disclosure. Connectors on a cable that are not properly seated in a port of a device can result in connectivity between the devices not being established, data loss, traffic disruption, downtime, and/or other issues that would be apparent to one of skill in the art in possession of the present disclosure.

Conventional solutions to such issues include performance of a visual inspection of the connector to determine if it is properly seated in a port on a device. However, situations may arise where a visual inspection of a connector on a cable may indicate that the connector is properly seated in the port of the device even through the connector is not properly seated in the port and connectivity cannot be established. Such situations may require physical layer troubleshooting that includes a physical presence at the device (e.g., because remote troubleshooting has no way of diagnosing the improper connector seating problem), calls to support providers, other and/or other time-consuming troubleshooting activities that may eventually result in the incorrect reporting of a faulty or failed port and the dispatch of a new device.

Accordingly, it would be desirable to provide a connector seating detection system that addresses the issues discussed above.

SUMMARY

According to one embodiment, an Information Handling System (IHS) includes a processing system; and a memory system that is coupled to the processing system and that includes instructions that, when executed by the processing system, cause the processing system to provide a connector seating detection engine that is configured to: receive, in response to a connector being positioned in a port that is coupled to the processing system while not engaging at least one port communication contact that is included in the port by a threshold amount, an unseated connector signal from a connector seating sensor that is located adjacent the port; generate, in response to receiving the unseated connector signal, an unseated connector indication; receive, in response to a connector being positioned in the port while engaging the at least one port communication contact by the threshold amount, a seated connector signal from the connector seating sensor; and generate, in response to receiving the seated connector signal, a seated connector indication.

BRIEF DESCRIPTION OF THE DRAWINGS

FIG. 2A is a schematic view illustrating an embodiment of a networking device that may include the connector seating detection system of the present disclosure.

FIG. 7B is a side view illustrating an embodiment of the connector of FIG. 4 coupled to but improperly seated in the port of FIG. 3 during the method of FIG. 5.

DETAILED DESCRIPTION

For purposes of this disclosure, an information handling system may include any instrumentality or aggregate of instrumentalities operable to compute, calculate, determine, classify, process, transmit, receive, retrieve, originate, switch, store, display, communicate, manifest, detect, record, reproduce, handle, or utilize any form of information, intelligence, or data for business, scientific, control, or other purposes. For example, an information handling system may be a personal computer (e.g., desktop or laptop), tablet computer, mobile device (e.g., personal digital assistant (PDA) or smart phone), server (e.g., blade server or rack server), a network storage device, or any other suitable device and may vary in size, shape, performance, functionality, and price. The information handling system may include random access memory (RAM), one or more processing resources such as a central processing unit (CPU) or hardware or software control logic, ROM, and/or other types of nonvolatile memory. Additional components of the information handling system may include one or more disk drives, one or more network ports for communicating with external devices as well as various input and output (I/O) devices, such as a keyboard, a mouse, touchscreen and/or a video display. The information handling system may also include one or more buses operable to transmit communications between the various hardware components.

Figure 1:
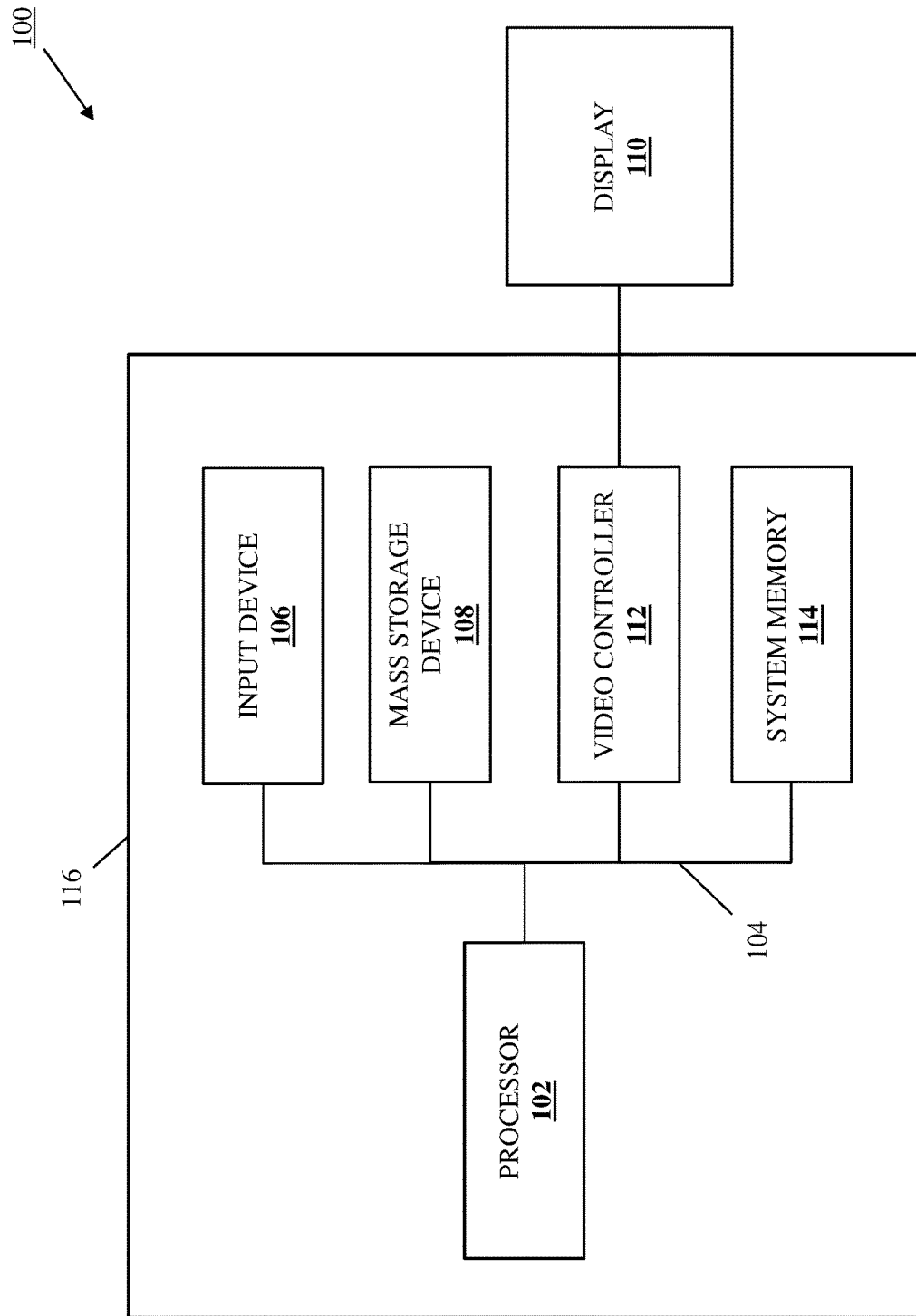
FIG. 1 is a schematic view illustrating an embodiment of an Information Handling System (IHS).

In one embodiment, IHS 100, FIG. 1, includes a processor 102, which is connected to a bus 104. Bus 104 serves as a connection between processor 102 and other components of IHS 100. An input device 106 is coupled to processor 102 to provide input to processor 102. Examples of input devices may include keyboards, touchscreens, pointing devices such as mouses, trackballs, and trackpads, and/or a variety of other input devices known in the art. Programs and data are stored on a mass storage device 108, which is coupled to processor 102. Examples of mass storage devices may include hard discs, optical disks, magneto-optical discs, solid-state storage devices, and/or a variety of other mass storage devices known in the art. IHS 100 further includes a display 110, which is coupled to processor 102 by a video controller 112. A system memory 114 is coupled to processor 102 to provide the processor with fast storage to facilitate execution of computer programs by processor 102. Examples of system memory may include random access memory (RAM) devices such as dynamic RAM (DRAM), synchronous DRAM (SDRAM), solid state memory devices, and/or a variety of other memory devices known in the art. In an embodiment, a chassis 116 houses some or all of the components of IHS 100. It should be understood that other buses and intermediate circuits can be deployed between the components described above and processor 102 to facilitate interconnection between the components and the processor 102.

Referring now to FIG. 2A, an embodiment of a networking device 200 is illustrated that may include the connector seating detection system of the present disclosure. In an embodiment, the networking device 200 may be provided by the IHS 100 discussed above with reference to FIG. 1, and/or may include some or all of the components of the IHS 100, and in specific examples may be provided by a switch device, a router device, and/or other networking devices known in the art. However, while illustrated and discussed as being provided by particular networking devices, one of skill in the art in possession of the present disclosure will appreciate how the connection seating detection system of the present disclosure may be provided in other computing devices having ports while remaining within the scope of the present disclosure as well. In the illustrated embodiment, the networking device 200 includes a chassis 202 that may house the components of the networking device 200, only some of which are illustrated and discussed below. For example, the chassis 202 may house a processing system (not illustrated, but which may include the processor 102 discussed above with reference to FIG. 1) and a memory system (not illustrated, but which may include the memory 114 discussed above with reference to FIG. 1) that is coupled to the processing system and that includes instructions that, when executed by the processing system, cause the processing system to provide a connector seating detection engine 204 that is configured to perform the functionality of the connector seating detection engines and/or networking devices discussed below.

The chassis 202 may also house a storage system (not illustrated, but which may include the storage device 108 discussed above with reference to FIG. 1) that is coupled to the connector seating detection engine 204 (e.g. via a coupling between the storage system and the processing system) and that may include a connector seating detection database 206 that is configured to store any of the information utilized by the connector seating detection engine 204 as discussed below. The chassis 202 may also house a communication system 208 that includes a plurality of ports 210, that is coupled to the connector seating detection engine 204 (e.g. via a coupling between the communication system 208 and the processing system), and that may be provided by a Network Interface Controller (NIC) and/or any other communication components that would be apparent to one of skill in the art in possession of the present disclosure. In an embodiment, the ports 210 may be provided by, for example, "copper" ports (1G/10GbaseT copper ports), optical ports, power ports, and/or other ports that would be apparent to one of skill in the art in possession of the present disclosure.

Figure 2B:
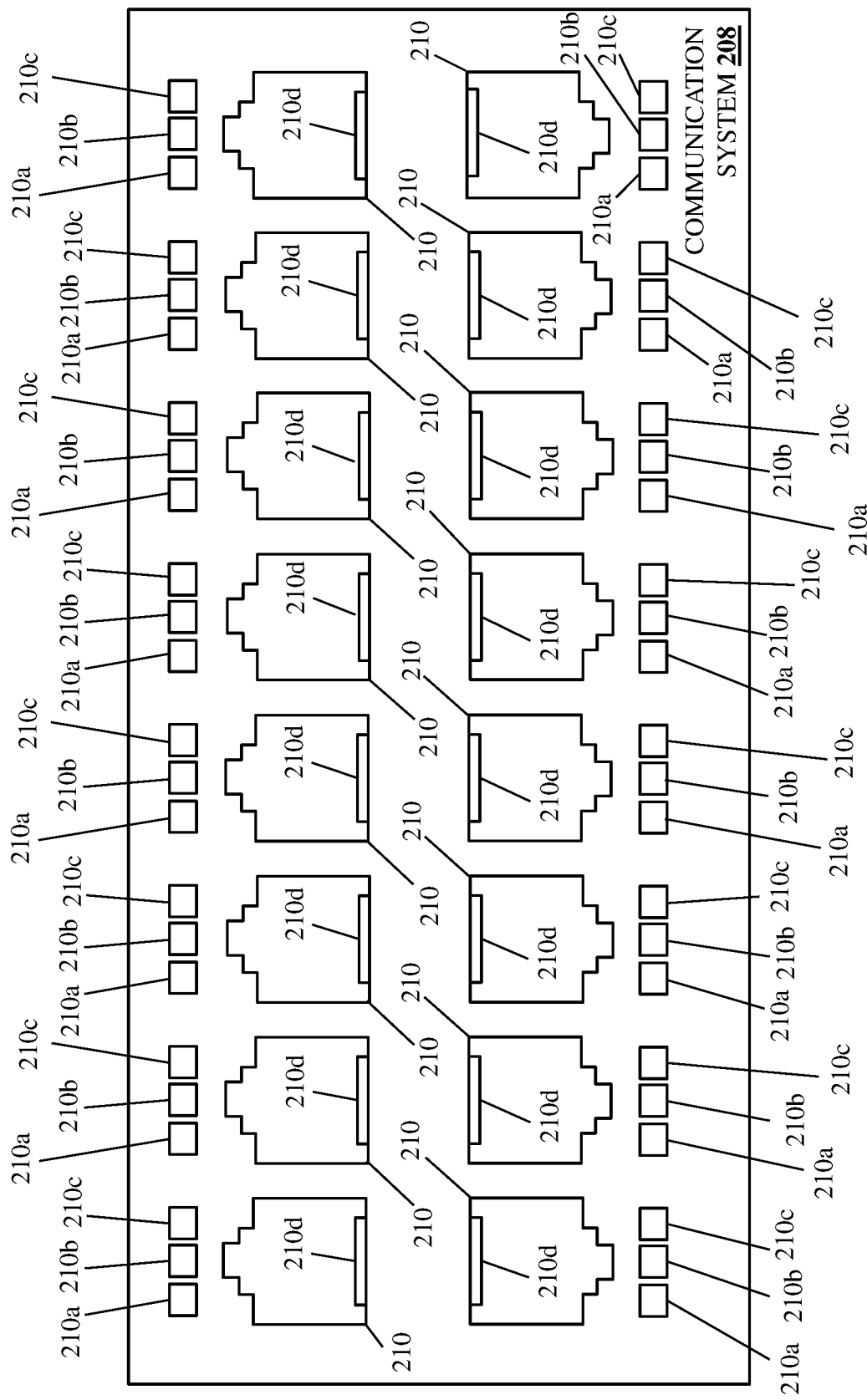
FIG. 2B is a front view illustrating an embodiment of ports on a communication system that may be included in the networking device of FIG. 2A.

Referring to FIG. 2B, a specific embodiment of a front view of the communication system 208 on the networking device 200 of FIG. 2A is illustrated. As such, the communication system 208 includes the plurality of ports 210 which may be provided by, for example, "copper" ports (1G/10GbaseT copper ports), optical ports, power ports, and/or other ports that would be apparent to one of skill in the art in possession of the present disclosure. In the illustrated embodiment, each of the ports 210 is associated with a plurality of indicators 210*a*, 210*b* and 210*c*. For example, the indicators 210*a*-210*c* associated with each port 210*n* may be provided by Light Emitting Devices (LEDs) and/or other indicators that would be apparent to one of skill in the art in possession of the present disclosure. As discussed below, LEDs that provide the indicators 210*a*-210*c* may be configured to illuminate with different colors, but one of skill in the art in possession of the present disclosure will appreciate how different indicators may be configured to provide different indications using a variety of techniques while remaining within the scope of the present disclosure as well.

In the illustrated, each of the ports 210 also includes a port communication contact 210*d* that is located in the port 210 and that, as discussed below, is configured to engage with a connector communication contact on a connector in order to allow data to be transmitted between that connector and the port 210. As will be appreciated by one of skill in the art in possession of the present disclosure, the communication system 208 is illustrated and described herein as being provided by an Ethernet communication system having Ethernet ports, but one of skill in the art in possession of the present disclosure will appreciate how the communication system 208 may include other ports (e.g., console ports, management ports, etc.), and/or how other systems may utilize other port technologies, while remaining within the scope of the present disclosure as well. As such, while a particular communication system 208 has been illustrated and described, one of skill in the art in possession of the present disclosure will appreciate that port systems utilizing the connector seating detection system of the present disclosure may include other components while remaining within the scope of the present disclosure. Furthermore, while a specific networking device 200 has been illustrated and described, one of skill in the art in possession of the present disclosure will recognize that networking devices (or other devices operating according to the teachings of the present disclosure in a manner similar to that described below for the networking device 200) may include a variety of components and/or component configurations for providing conventional device functionality, as well as the functionality discussed below, while remaining within the scope of the present disclosure as well.

Figure 3:
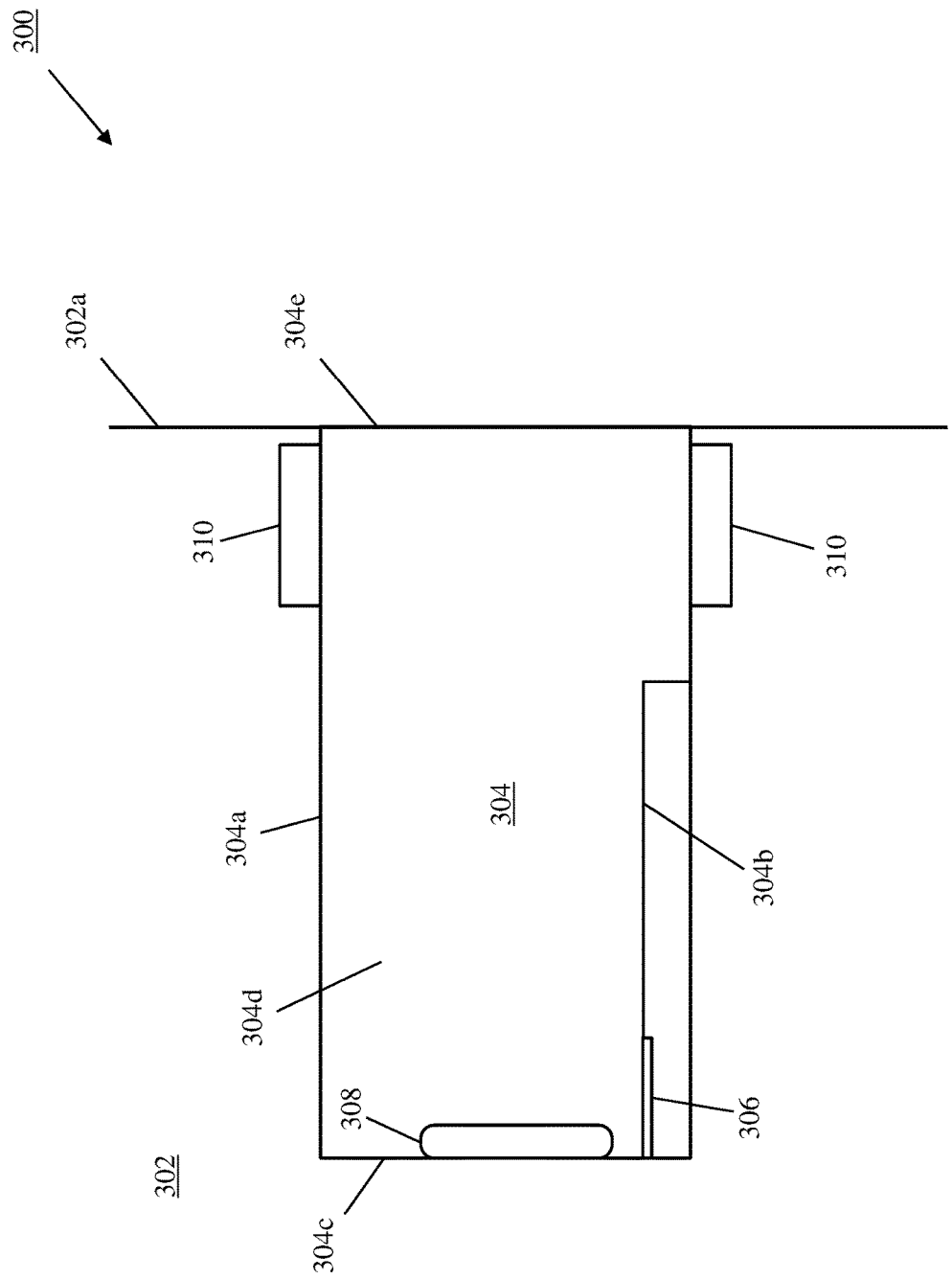
FIG. 3 is a side view illustrating an embodiment of a port that may be included in the communication system of FIG. 2B.

Referring now to FIG. 3, an embodiment of a port 300 is illustrated that may provide any of the ports 210 discussed above with reference to FIGS. 2A and 2B. As such, the port 300 may be provided by, for example, "copper" ports (1G/10GbaseT copper ports), optical ports, power ports, and/or other ports that would be apparent to one of skill in the art in possession of the present disclosure. Furthermore, while one of skill in the art in possession of the present disclosure will recognize that the port 300 is illustrated as being provided by an Ethernet port, other types of ports (e.g., console ports, management ports, power ports, video ports, audio ports, Universal Serial Bus (USB) ports, etc.) will fall within the scope of the present disclosure as well. In the illustrated embodiment, the port 300 is accessible on an outer surface 302a of a chassis 302 that may be provided by the chassis 202 discussed above with reference to FIG. 2A and defines a port housing 304 that extends into the chassis 302 from the outer surface 302a. The port housing 304 is defined by a port housing top surface 304a, a port housing bottom surface 304b that is located opposite the port housing 304 from the port housing top surface 304a, a port housing rear surface 304c that extends between the port housing top surface 304a and the port housing bottom surface 304b, and a pair of opposing port housing side surfaces (with a port housing side surface 304d visible in FIG. 3) that are located opposite the port housing 304 from each other and that extend between the port housing top surface 304a, the port housing bottom surface 304b, and the port housing rear surface 304c. Furthermore, a port entrance 304e is defined opposite the port housing 304 from the port housing rear surface 304c and is located substantially co-planar with the outer surface 302a of the chassis 302. While not illustrated, one of skill in the art in possession of the present disclosure will appreciate how the port housing 304 may include a securing feature that is configured to secure a connector in the port 300.

In the illustrated embodiment, the port 300 includes a port communication contact 306 that is located on the port housing bottom surface 304b adjacent the port housing rear surface 304c, and that may provide any of the port communication contacts 204d discussed above with reference to FIG. 2B. However, while a particular location of the port communication contact 306 has been illustrated and described, one of skill in the art will appreciate that the portion communication contact 306 may be provided in other locations in the port housing 304 while remaining within the scope of the present disclosure as well. As illustrated, the port 300 may also include a connector seating sensor 308 that is located on the port housing rear surface 304c. In an example, the connector seating sensor 308 may be provided by a pressure sensor device such as a Thin-Film pressure sensor device and/or other pressure sensor devices that would be apparent to one of skill in the art in possession of the present disclosure. However, while a particular type of connector seating sensor provided in a particular location in the port housing 304 has been illustrated and described, one of skill in the art in possession of the present disclosure will appreciate how other types of sensors (e.g., light-based sensor devices, radio-frequency-based sensor device, etc.) may be provided in other locations in the port housing 304 while providing the functionality of the connector seating sensor 308 discussed below while remaining within the scope of the present disclosure.

As illustrated, the port 300 may also include a connector presence sensor 310 that, in the illustrated embodiment, is provided adjacent the port housing top surface 304a and the port housing bottom surface 304b, as well as adjacent the port entrance 304e. In an example, the connector presence sensor 310 may be provided by a light-based sensor having a light transmitter (e.g., a laser) located adjacent the port housing top surface 304a as well as the port entrance 304a, and a light receiver located adjacent the port housing bottom surface 304b as well as the port entrance 304e. As discussed below, the connector presence sensor 310 may be an optional component that may be omitted from the port 300 and, as such, the port 300 may include only the connector seating sensor 308 discussed above to provide the connector seating detection functionality described below. However, while a particular type of connector presence sensor provided in a particular location in the port housing 304 has been illustrated and described, one of skill in the art in possession of the present disclosure will appreciate how other types of sensors (e.g., pressure sensor devices, radio-frequency-based sensor device, etc.) may be provided in other locations in the port housing 304 while providing the functionality of the connector presence sensor 310 discussed below while remaining within the scope of the present disclosure. Furthermore, while a particular port 300 has been illustrated and described, one of skill in the art in possession of the present disclosure will appreciate that ports on the connector seating detection system of the present disclosure may include other components and/or component configurations while remaining within the scope of the present disclosure.

Figure 4:
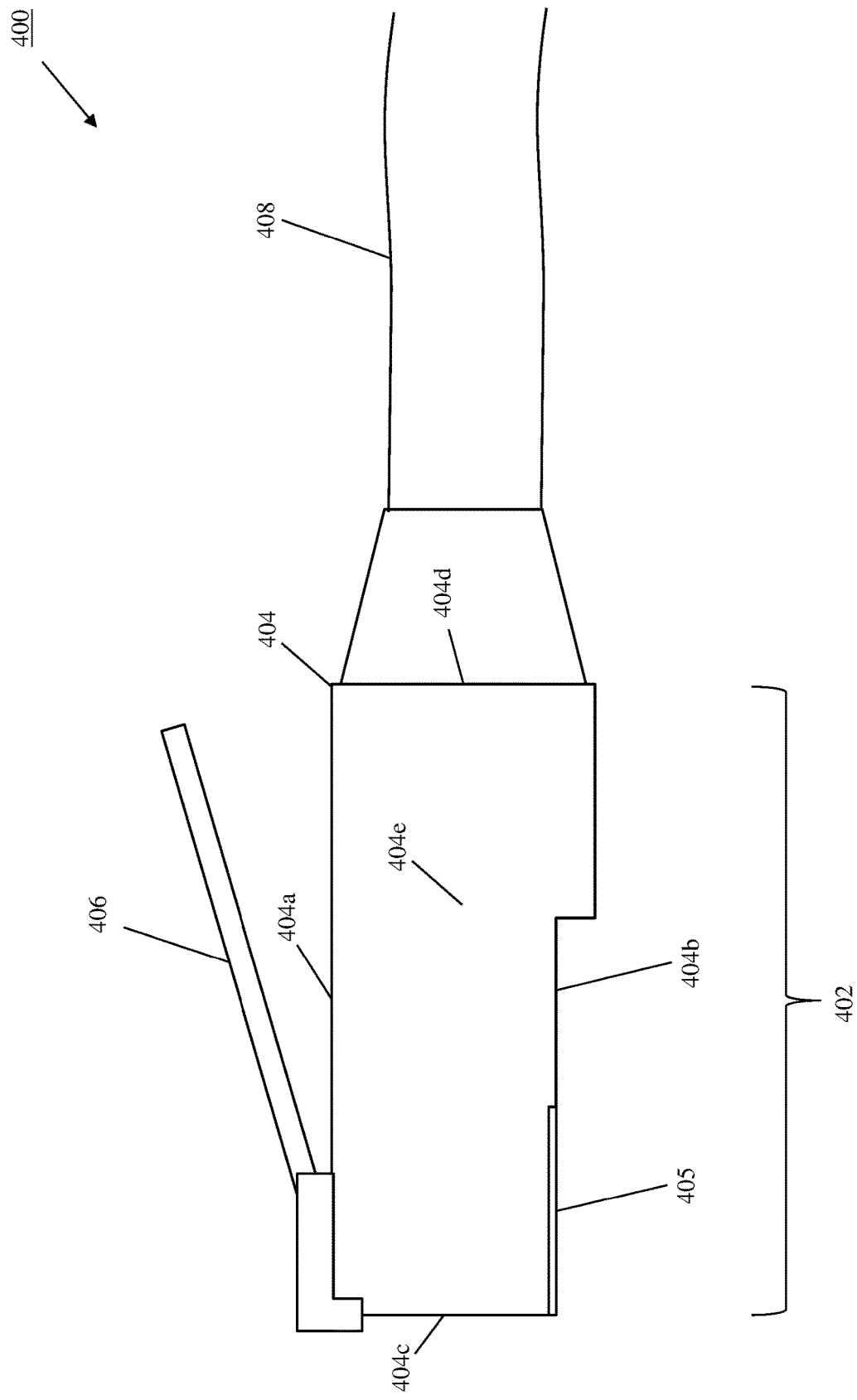
FIG. 4 is a side view illustrating an embodiment of cabling system that may be utilized with the networking device of FIG. 2A.

Referring now to FIG. 4, an embodiment of a cabling system 400 is illustrated that may be used with the networking device 200 of FIGS. 2A and 2B and/or the port 300 of FIG. 3 discussed above. In the illustrated embodiment, the cabling system 400 includes a connector 402 having a connector base 404. In a specific example, the connector 402 may be a "copper" connector, an optical connector, a power connector, and/or other connectors that would be apparent to one of skill in the art in possession of the present disclosure. Furthermore, one of skill in the art in possession of the present disclosure will appreciate that while the connector 402 is illustrated and described as being provided by an Ethernet connector (e.g., a CAT5, CAT6, or other type of Ethernet connector), other types of connectors will fall within the scope of the present disclosure as well. The connector base 404 includes a top surface 404a, a bottom surface 404b located opposite the connector base 404 from the top surface 404a, a front surface 404c that extends between the top surface 404a and the bottom surface 404b, a rear surface 404d that is located opposite the connector base 404 from the front surface 404a and that extends between the top surface 404a and the bottom surface 404b, and a pair of opposing side surfaces (with side surface 404e visible in FIG. 4) that are located opposite the connector base 404 from each other and that extend between the top surface 404a, the bottom surface 404b, the front surface 404c, and the rear surface 404d.

In the illustrated embodiment, the connector 402 includes a connector communication contact 405 that is located on the bottom surface 404b of the connector base 404 and adjacent the front surface 404c of the connector base 404. The connector 402 also includes a connector latch member 406 that extends from the top surface 404a of the connector base 404 adjacent the front surface 404c of the connector. While not illustrated, one of skill in the art in possession of the present disclosure will appreciate how the connector latch member 406 may include a securing feature that is configured to secure the connector 402 in a port. A cable 408 extends from the rear surface 404d of the connector base 404, and one of skill in the art in possession of the present disclosure will appreciate how the cable 408 may include an opposite end (not illustrated) that may include another connector, a device, and/or a variety of other cabling system components that would be apparent to one of skill in the art in possession of the present disclosure. One of skill in the art in possession of the present disclosure will recognize that the cabling system 400 is illustrated and described as being provided by an Ethernet cable, but that other cabling systems and/or connectors may be utilized with the connector seating detection system of the present disclosure while remaining within its scope as well. one of skill in the art in possession of the present disclosure, while a particular cabling system has been illustrated and described, one of skill in the art in possession of the present disclosure will appreciate that cabling systems may include other components and/or component configurations while remaining within the scope of the present disclosure.

Figure 5:
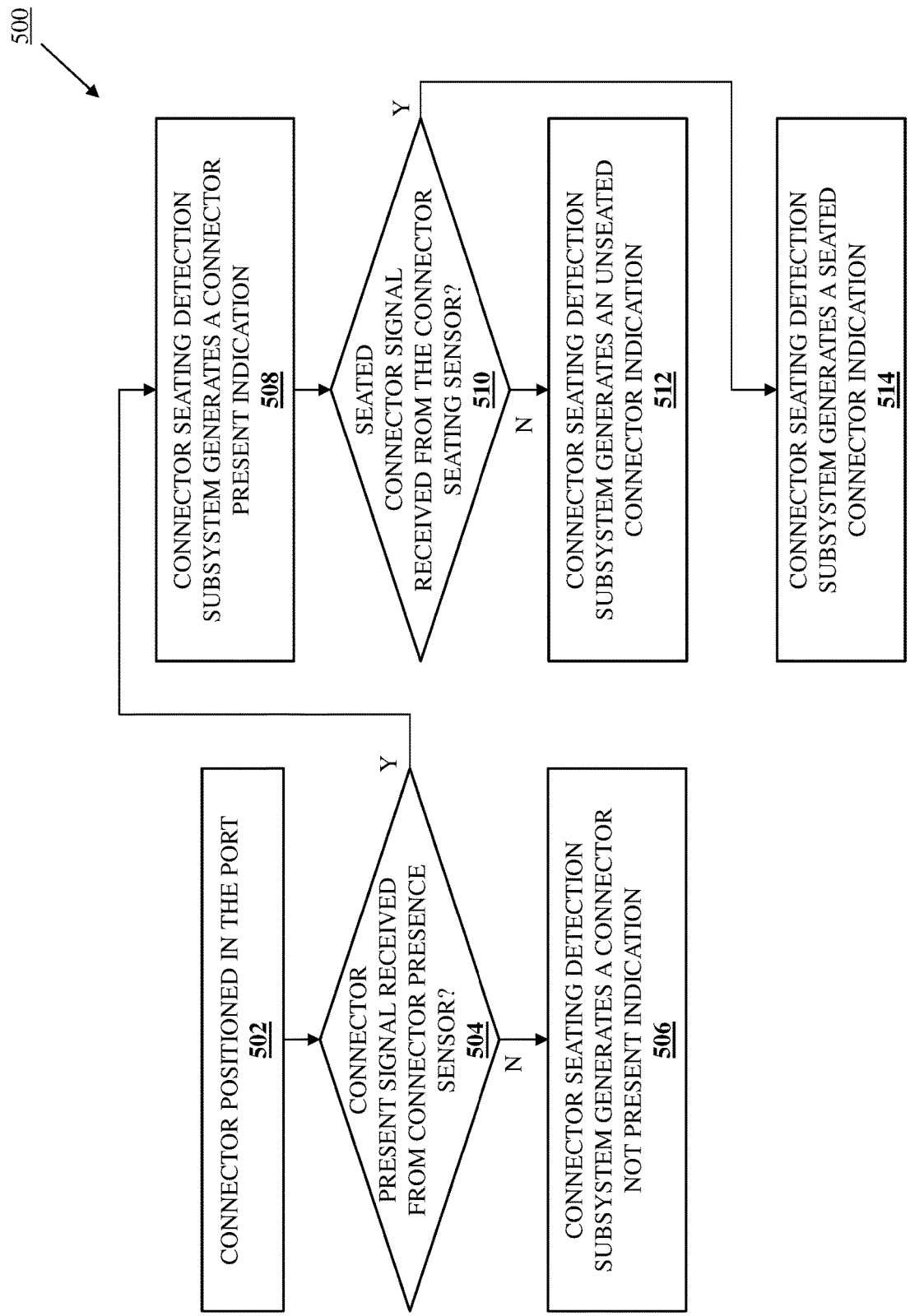
FIG. 5 is a flow chart illustrating an embodiment of a method for detecting the seating of a connector in a port on a device.

Referring now to FIG. 5, an embodiment of a method 500 for detecting whether a connector is seated in a port is illustrated. As discussed below, the systems and methods of the present disclosure are configured to determine a seating status of a connector in a port and provide an indication of that seating status to a user. For example, the connector seating detection system of the present disclosure may include a device having a port that includes at least one port communication contact. A connector seating sensor is located adjacent the port. A connector seating detection subsystem is coupled to the connector seating sensor. When a connector is positioned in the port while not engaging at least one port communication contact by a threshold amount, the connector seating detection subsystem receives an unseated connector signal from the connector seating sensor and, in response, generates an unseated connector indication. When a connector is positioned in the port while engaging at least one port communication contact the threshold amount, the connector seating detection subsystem receives a seated connector signal from the connector seating sensor and, in response, generates a seated connector indication. As will be appreciated by one of skill in the art in possession of the present disclosure, the systems and methods described herein operate to minimize time consuming trouble shooting of connection problems, data loss, network traffic disruption, and network downtime, while eliminating the need to be physically present in order to determine whether a connector is properly seated in a port.

Figure 6:
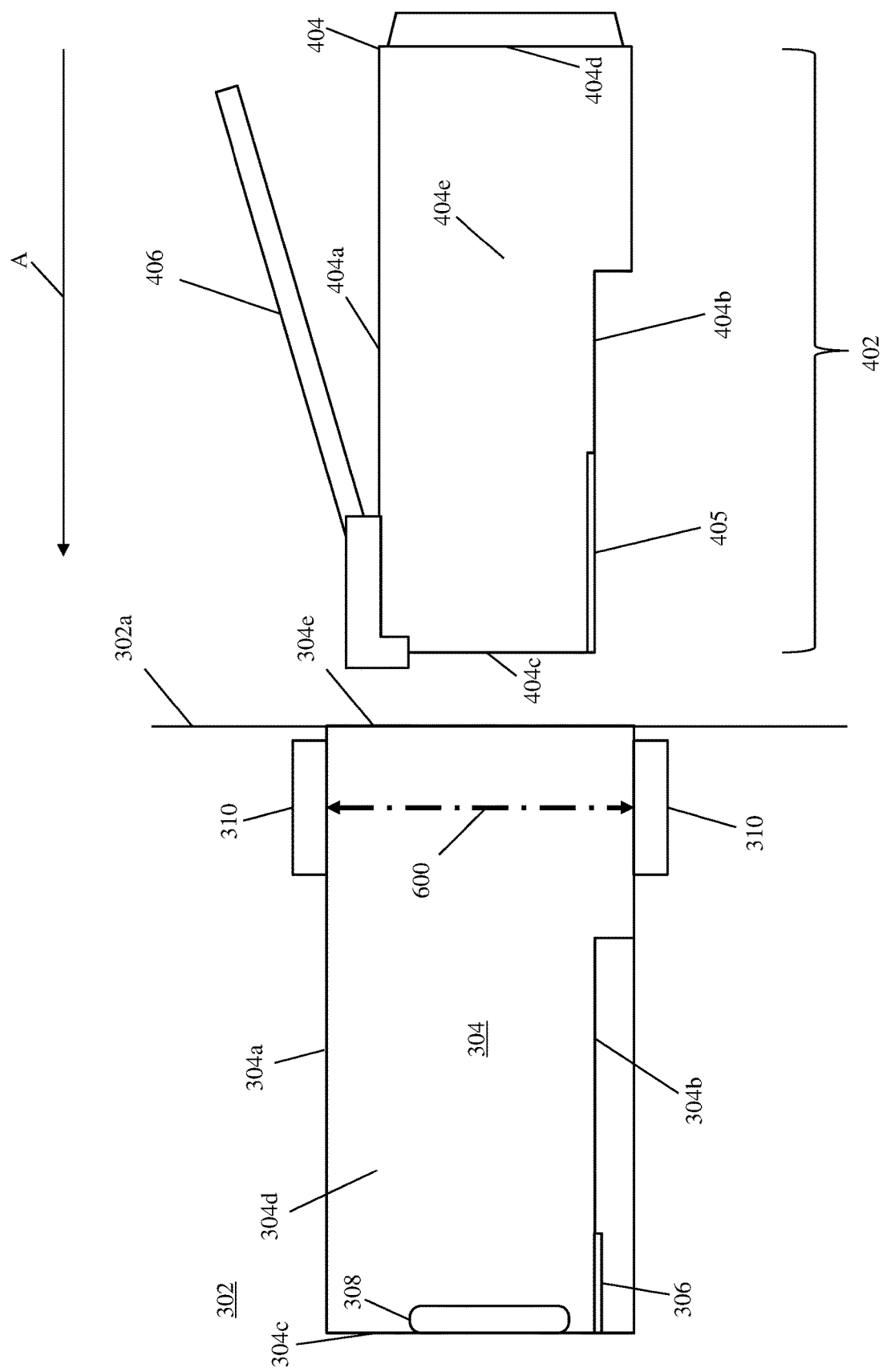
FIG. 6 is a side view illustrating an embodiment of the connector of FIG. 4 being coupled to the port of FIG. 3 during the method of FIG. 5.

The method 500 begins at block 502 where a connector is positioned in a port. With reference to FIG. 6, in an embodiment of block 502, the connector 402 may be positioned adjacent the port 300. For example, the connector base 404 of the connector 402 on the cabling system 400 may be positioned adjacent the port entrance 304e of the port housing 304 such that the front surface 404c of the connector base 404 is aligned with the port housing 304. As will be appreciated by one of skill in the art in possession of the present disclosure, the cable 408 on the cabling system 400 may be coupled to a device (e.g., to a server device via a connector coupled to an end of the cable 408 opposite the connector 402, not illustrated), and a user may grasp the connector 402 and position it adjacent the port 300 in order to prepare the cabling system 400 for coupling the connector 402 to the port 300 in order to connect that device to the networking device 200 (e.g., in order to provide networking connectivity for that device).

The connector base 404 on the connector 402 may then be moved in a direction A such that the connector base 404 moves through the port entrance 304e and into the port housing 304. As discussed above, in some embodiments, the positioning of the connector 402 in the port 300 may be sufficient to properly seat the connector 402 in the port 300, while in other embodiments the positioning of the connector 402 in the port 300 may not properly seat the connector 402 in the port 300. While two specific examples of these outcomes are illustrated and described below, one of skill in the art in possession of the present disclosure will appreciate how the proper and/or improper seating of connectors in ports may vary while remaining within the scope of the present disclosure as well.

Figure 7A:
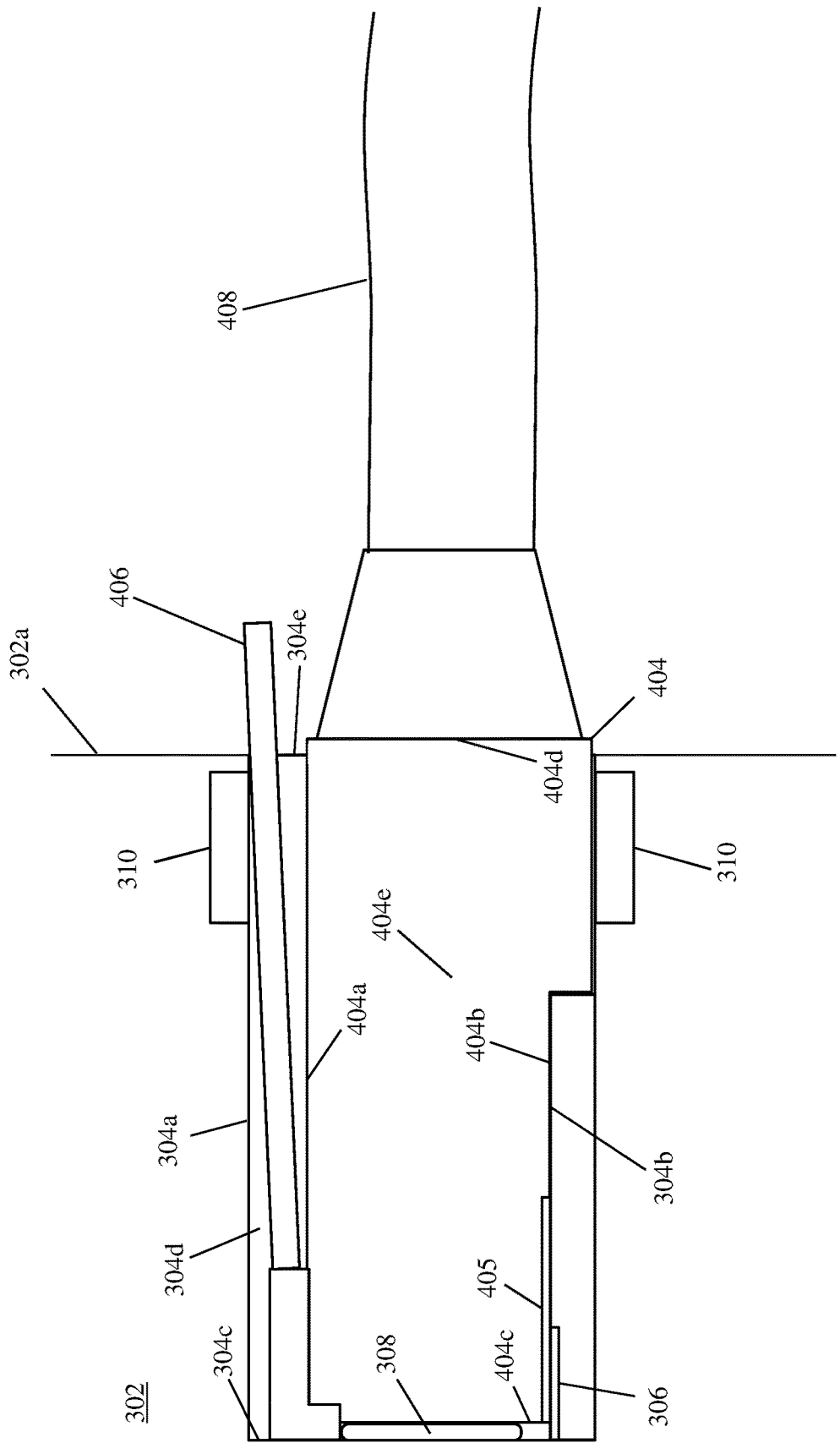
FIG. 7A is a side view illustrating an embodiment of the connector of FIG. 4 coupled to and properly seated in the port of FIG. 3 during the method of FIG. 5.

With reference to FIG. 7A, an embodiment of the proper seating of a connector in a port is illustrated. As can be seen in FIGS. 6 and 7A, the movement of the connector 402 in the direction A may cause the connector base 404 on the connector 402 to move through the port entrance 304e and into the port housing 304 until the front surface 404c of the connector base 404 is located adjacent the rear surface 304c of the port housing 304. As can be seen, when properly seated in the port 300, the connector communication contact 405 on the connector base 404 of the connector 402 will engage the port communication contact 306 in the port 300. Furthermore, one of skill in the art in possession of the present disclosure will appreciate how the securing feature on the latch member 406 (not illustrated) may engage the securing feature on the port housing 304 in order to secure the connector 402 in the port 300 when the connector 402 is properly seated in the port 300.

With reference to FIG. 7B, an embodiment of the improper seating of a connector in a port is illustrated. As can be seen in FIGS. 6 and 7B, the movement of the connector 402 in the direction A may cause the connector base 404 on the connector 402 to move through the port entrance 304e and into the port housing 304 similarly as discussed above with reference to FIG. 7A. However, that movement of the connector 402 may stop for a variety of reasons such that the front surface 404c of the connector base 404 is spaced apart from the rear surface 304c of the port housing 304, or the connector 402 may move subsequent to its proper seating in the port such that the front surface 404c of the connector base 404 becomes spaced apart from the rear surface 304c of the port housing 304 (e.g., due to a broken latch member 406 as discussed below). As can be seen, when improperly seated in the port 300, the connector communication contact 405 on the connector base 404 of the connector 402 may not engage the port communication contact 306 in the port 300.

However, while the connector communication contact 405 on the connector base 404 of the connector 402 is illustrated in FIG. 7B as not engaging any portion of the port communication contact 306 in the port 300, one of skill in the art in possession of the present disclosure will appreciate how partial engagements of the connector communication contact 405 on the connector base 404 of the connector 402 and the port communication contact 306 in the port 300 may be result in improper seating of the connector 402 in the port 300 as well. As such, a threshold amount of engagement of the connector communication contact 405 on the connector base 404 of the connector 402 and the port communication contact 306 may be defined such that contact 306/405 engagement above that threshold amount provides proper seating of the connector 402 and the port 300 (e.g., communications transmitted via the connector communication contact 405 and the port communication contact 306 exceed a minimum communication performance), and contact 306/405 engagement below that threshold amount result in improper seating of the connector 402 and the port 300 (e.g., communications transmitted via the connector communication contact 405 and the port communication contact 306 are below a minimum communication performance).

Furthermore, one of skill in the art in possession of the present disclosure will appreciate how the securing feature on the latch member 406 (not illustrated) may not engage the securing feature on the port housing 304 and prevent securing of the connector 402 in the port 300 when the connector 402 is improperly seated in the port 300. For example, one of skill in the art in possession of the present disclosure will appreciate how the securing of the connector 402 in the port 300 may be prevented due to the latch member 406 being broken, thus allowing the improper seating of the connector 402 in the port 300 (e.g., due to improper positioning of the connector 402 in the port 300, due to the connector 402 being moved relative to the port 300 subsequent to proper positioning, etc.). As discussed above, the positioning of the connector 402 in the port 300 as illustrated in FIG. 7B (or with an unseated status similar to that illustrated in FIG. 7B) may prevent a visual inspection of the connector 402/port 300 connection from recognizing the improper seating of the connector 402 in the port 300, as the connector 402 may appear properly connected to the port 300 in such situations.

The method 500 may then proceed to decision block 504 where it is determined whether a connector present signal is received from a connector presence sensor. In an embodiment, at decision block 504, the connector seating detection engine 204 in the networking device 200 may determine if a connector present signal is received from the connector presence sensor 310. With reference back to FIGS. 6 and 7A, the movement of the connector 402 in the direction A may cause the connector base 404 on the connector 402 to move past the connector presence sensor 310. As will be appreciated by one of skill in the art in possession of the present disclosure, as the connector 402 moves into the port housing 304, it may be detected by the connector presence sensor 310 (e.g., by "breaking" a path of a laser/light 600 provided by the connector presence sensor 310 between a light transmitter (e.g., a laser) located adjacent the port housing top surface 304a as well as the port entrance 304e, and a light receiver located adjacent the port housing bottom surface 304b as well as the port entrance 304e), and the connector presence sensor 310 may be configured to generate a connector present signal (e.g., a "1" or other data that would be apparent to one of skill in the art in possession of the present disclosure) in response to detecting the connector 402, while generating a connector not present signal (e.g., a "0" or other data that would be apparent to one of skill in the art in possession of the present disclosure) in response to not detecting the connector 402. As will be appreciated by one of skill in the art in possession of the present disclosure, the connector seating detection engine 204 in the networking device 200 may be configured to continuously or periodically poll the connector presence sensor 310 for the connector present signal or connector not present signal in order to provide the connector present indications or connector not present indications discussed below.

However, while a specific example of a connector presence sensor has been described, one of skill in the art in possession of the present disclosure will appreciate that other types of sensors (e.g., pressure sensor devices, radio-frequency-based sensor device, etc.) maybe utilized to determine the presence of a connector while remaining within the scope of the present disclosure. Furthermore, as discussed above, the connector presence sensor 310 may be an optional component in the port 300 and thus in some embodiments the port 300 may include only the connector seating sensor 308 while omitting the connector presence sensor 310, with the method 500 proceeding from block 502 directly to decision block 510, discussed below.

If, at decision block 504, it is determined that a connector present signal is not received from the connector presence sensor, the method 500 proceeds to block 506 where a connector seating detection subsystem generates a connector not present indication. In an embodiment, at block 506, the connector seating detection engine 204 in the networking device 200 may receive a connector not present signal from the connector presence sensor 310 and, as a result, may generate a connector not present indication.

Figure 8:
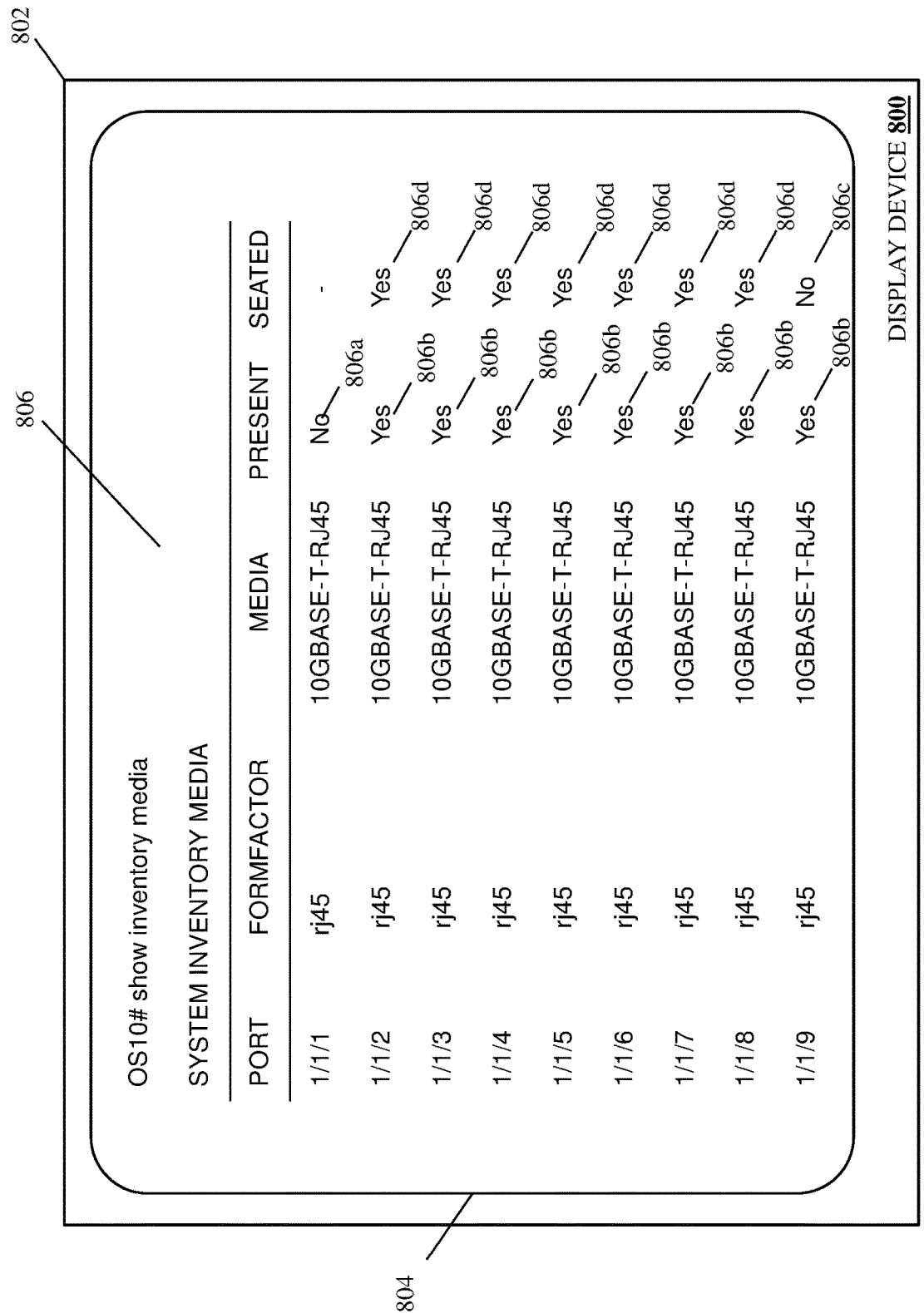
FIG. 8 is a screen view illustrating an embodiment of a display device displaying a connector seating reporting screen during the method of FIG. 5.

Referring now to FIG. 8, an embodiment of a display device 800 including a display chassis 802 having a display screen 804 is illustrated. For example, the display device 800 may be included on or coupled to a management device that is configured to manage the networking device 200. As will be appreciated by one of skill in the art in possession of the present disclosure, the display device 800 is illustrated in FIG. 8 as displaying a Command Line Interface (CLI) connector seating reporting screen 806 on the display screen 804 that is configured to display management information for the networking device 200 to a user (in response to an administrator CLI command), and one of skill in the art in possession of the present disclosure will appreciate how that management information may allow for remote troubleshooting of the networking device 200 without a need for physical presence at the networking device 200. In an embodiment, at block 506, the connector seating detection engine 204 may generate and provide a connector not present indication 806a on the CLI connector seating reporting screen 806 (e.g., "No" in a "PRESENT" column included in the management information) in response to receiving the connector not present signal from the connector presence sensor 310.

As such, one of skill in the art in possession of the present disclosure will appreciate how ports 210/300 on the networking device 200 that do not have a connector positioned therein may cause the connector not present indication 806a to be displayed on the CLI connector seating reporting screen 806 in association with an identifier for that port, as illustrated in FIG. 8 for port 1/1/1. However, while a CLI screen is illustrated and described as being used to display the connector not present indication, one of skill in the art in possession of the present disclosure will appreciate how other techniques (e.g., Graphical User Interfaces (GUIs), Light Emitting Devices (LEDs), and/or other indicator subsystems that would be apparent to one of skill in the art in possession of the present disclosure) may be used to display the connector not present indication while remaining within the scope of the present disclosure as well.

If, at decision block 504, it is determined that the connector present signal is received from the connector presence sensor, the method 500 proceeds to block 508 where the connector seating detection subsystem generates a connector present indication. In an embodiment, at block 506, the connector seating detection engine 204 in the networking device 200 may receive a connector present signal from the connector presence sensor 310 and, as a result, may generate a connector present indication.

With reference back to FIG. 8, in an embodiment of block 508, the connector seating detection engine 204 may generate and provide a connector present indication 806b on the CLI connector seating reporting screen 806 in response to receiving the connector present signal from the connector presence sensor 310. As such, one of skill in the art in possession of the present disclosure will appreciate how ports 210/300 on the networking device 200 that have a connector positioned therein (e.g., whether properly seated or not) may cause the connector present indication 806b to be displayed on the CLI connector seating reporting screen 806 in association with an identifier for that port, as illustrated in FIG. 8 for port 1/1/2 to 1/1/9. However, while a CLI screen is illustrated and described as being used to display the connector present indication, one of skill in the art in possession of the present disclosure will appreciate how other techniques (e.g., Graphical User Interfaces (GUIs), Light Emitting Devices (LEDs), and/or other indicator subsystems that would be apparent to one of skill in the art in possession of the present disclosure) may be used to display the connector present indication while remaining within the scope of the present disclosure as well.

Furthermore, in embodiments in which the connector seating detection engine 204 generates a connector present indication, in some situations that connector present indication may not be explicitly provided for display as illustrated in FIG. 8. For example, the connector present indication (or other indication that a connector is present in a port) may be provided by the connection seating detection engine 204 via the seated connector indication discussed below. As such, in some embodiments, the CLI connector seating reporting screen 806 in FIG. 8 may not include the "PRESENT" column that provides the connector not present indication 806a and connector present indications 806b.

Following block 508, or following block 502 in embodiments in which the optional connector presence sensor 310 is omitted from the port 300, the method 500 then proceeds to decision block 510 where it is determined whether a seated connector signal is received from a connector seating sensor. In an embodiment, at decision block 510, the connector seating detection engine 204 in the networking device 200 may determine if a seated connector signal is received from the connector seating sensor 308. With reference back to FIGS. 6, 7A, and 7B and as discussed above, the movement of the connector 402 in the direction A may cause the connector base 404 on the connector 402 to move into the port housing 304 and, in some embodiments, engage the connector seating sensor 308 a threshold amount (e.g., as a result of the front surface 404c of the connector base 404 of connector 402 coming into contact with and compressing the connector seating sensor 308, as illustrated in the specific example in FIG. 7A), or not engage the connector seating sensor the threshold amount (e.g., as a result of the front surface 404c of the connector base 404 of connector 402 not coming into contact with the connector seating sensor 308, as illustrated in the specific example in FIG. 7B).

As will be appreciated by one of skill in the art in possession of the present disclosure, the connector seating sensor 308 may be configured to generate a seated connector signal (e.g., a "1" or other data that would be apparent to one of skill in the art in possession of the present disclosure) in response to a threshold level of engagement with the connector 402, while generating an unseated connector signal (e.g., a "0" or other data that would be apparent to one of skill in the art in possession of the present disclosure) in response to not detecting the threshold level of engagement with the connector 402. For example, as discussed above, a threshold amount of engagement of the connector communication contact 405 on the connector base 404 of the connector 402 and the port communication contact 306 may be defined such that contact 306/405 engagement above that threshold amount provides proper seating of the connector 402 and the port 300 (e.g., communications transmitted via the connector communication contact 405 and the port communication contact 306 exceed a minimum communication performance), and contact 306/405 engagement below that threshold amount result in improper seating of the connector 402 and the port 300 (e.g., communications transmitted via the connector communication contact 405 and the port communication contact 306 are below a minimum communication performance). As such, the connector seating sensor 308 may be sized, positioned, and/or otherwise configured to determine whether the contact 306/405 engagement exceeds the threshold amount indicative of proper seating of the connector 402 and the port 300.

Thus, the connector seating sensor 308 may be sized, positioned, and/or otherwise configured such that any engagement of the connector 402 and the connector seating sensor 308 exceeds the threshold amount of contact 306/405 engagement that is indicative of proper seating of the connector 402 and the port 300, such that a threshold level of engagement of the connector 402 and the connector seating sensor 308 (e.g., a threshold level of compression) is required to exceed the threshold amount of contact 306/405 engagement that is indicative of proper seating of the connector 402 and the port 300, and/or using other connector seating sensor configurations that would be apparent to one of skill in the art in possession of the present disclosure.

However, while a specific example of a connector seating sensor that is provided by a pressure sensor device and that generates a seated connector signal has been described, one of skill in the art in possession of the present disclosure will appreciated that other types of sensor devices (e.g., light-based sensor devices, radio-frequency-based sensor device, etc.) may be utilized to determine if a connector is properly seated within a port and generate a corresponding seated connector signal while remaining within the scope of the present disclosure. As will be appreciated by one of skill in the art in possession of the present disclosure, the connector seating detection engine 204 in the networking device 200 may be configured to continuously or periodically poll the connector seating sensor 308 for the seated connector signal or unseated connector signal in order to provide the seated connector indications or unseated connector indications discussed below.

If, at decision block 510, it is determined that the seated connector signal is not received from the connector seating sensor 308, the method 500 proceeds to block 512 where the connector seating detection subsystem generates an unseated connector indication. In an embodiment, at block 512 and as a result of no connector engaging the connector seating sensor 308 in the port 300 (or a connector engaging the connector seating sensor 308 by less than the threshold amount), the connector seating sensor 308 may generate an unseated connector signal, and the connector seating detection engine 204 in the networking device 200 may receive an unseated connector signal and generate an unseated connector indication.

Referring back to FIG. 8 and the CLI connector seating reporting screen 806 on the display device 800 that is displaying management information for the networking device 200 to a user (in response to an administrator CLI command), in an embodiment of block 512, the connector seating detection engine 204 may generate and provide an unseated connector indication 806*c* on the CLI connector seating reporting screen 806 (e.g., "No" in a "SEATED" column included in the management information) in response to receiving the unseated connector signal from the connector seating sensor 308.

As such, one of skill in the art in possession of the present disclosure will appreciate how ports 210/300 on the networking device 200 that do not have a seated connector therein may cause the unseated connector indication 806*c* to be displayed on the CLI connector seating reporting screen 806 in association with an identifier for that port, as illustrated in FIG. 8 for port 1/1/9. However, while a CLI screen is illustrated and described as being used to display the unseated connector indication, one of skill in the art in possession of the present disclosure will appreciate how other techniques (e.g., Graphical User Interfaces (GUIs), Light Emitting Devices (LEDs), and/or other indicator subsystems that would be apparent to one of skill in the art in possession of the present disclosure) may be used to display the unseated connector indication while remaining within the scope of the present disclosure as will.

As discussed above, some embodiments of the port 300 of present disclosure may include only the connector seating sensor 308 while omitting the connector presence sensor 310, and in such embodiments the seated connector indication or the unseated connector indication may be provided based only on whether the connector 402 engages the connector seating sensor 308 the threshold amount as discussed above. However, one of skill in the art in possession of the present disclosure will appreciate how combinations of the connector seating sensor 308 and the connector presence sensor 310 may provide benefits in detecting and indicating whether a connector is properly seated in a port. For example, in embodiments of the port 300 that include the connector seating sensor 308 and the connector presence sensor 310, the unseated connector indication may only be provided when a connector is both present in the port (e.g., identified via the connector present signal for port 1/1/9 in FIG. 8) and not seated in that port (.g., identified via the unseated connector signal for port 1/1/9 in FIG. 8), while the connector not present indication is provided when no connector is present in the port (e.g., identified via the connector not present signal for port 1/1/1 in FIG. 8), and the seated connector indication is provided when a connector is both present in the port (e.g., identified via the connector present signal for ports 1/1/2-1/1/8 in FIG. 8) and seated in that port (e.g., identified via the seated connector signal for ports 1/1/2-1/1/8 in FIG. 8, discussed in further detail below).

As such, in some situations where the connector-seating-sensor-only embodiment would indicate an unseated connector to a user (i.e., an unseated connector indication due to engagement of connector with the connector seating sensor 308 less than the threshold amount) when no connector is present in the port 300, the connector seating sensor/connector presence sensor embodiment will distinguish between whether a connector is present in the port and unseated (e.g., with the unseated connector indication) or whether a connector is not present in the port (with the connector not present indication). However, one of skill in the art in possession of the present disclosure will recognize that the connector-seating-sensor-only embodiment provides benefits that will be sufficient in many (if not most) situations for users of the networking device 200.

If, at decision block 510, it is determined that the seated connector signal is received from the connector seating sensor 308, the method 500 proceeds to block 514 where the connector seating detection subsystem generates a seated connector indication. In an embodiment, at block 514 and as a result of a connector engaging the connector seating sensor 308 in the port 300 the threshold amount, the connector seating sensor 308 will generate a seated connector signal, and the connector seating detection engine 204 in the networking device 200 will receive a seated connector signal and generate a seated connector indication.

With reference back to FIG. 8, in an embodiment of block 514, the connector seating detection engine 204 may generate and provide a seated connector indication 806*d* on the CLI connector seating reporting screen 806 (e.g., "Yes" in a "SEATED" column included in the management information) in response to receiving the seated connector signal from the connector seating sensor 308. As such, one of skill in the art in possession of the present disclosure will appreciate how ports 210/300 on the networking device 200 that have a seated connector therein may cause the seated connector indication 806*d* to be displayed on the CLI connector seating reporting screen 806 in association with an identifier for that port, as illustrated in FIG. 8 for port 1/1/2 to 1/1/8. However, while a CLI screen is illustrated and described as being used to display the seated connector indication, one of skill in the art in possession of the present disclosure will appreciate how other techniques (e.g., Graphical User Interfaces (GUIs), Light Emitting Devices (LEDs), and/or other indicator subsystems that would be apparent to one of skill in the art in possession of the present disclosure) may be used to display the seated connector indication while remaining within the scope of the present disclosure as well.

As discussed above, in embodiments in which the connector presence sensor 310 is not omitted from the port 210/300, the connector present indication and the seated connector indication may be combined to provide the seated connector indication or the unseated connector indication. For example, where the connector seating detection engine 204 receives both the seated connector signal from the seated connector sensor 308 and the connector present signal from the connector presence sensor 310, the connector seating detection engine 204 may provide only the seated connector indication 806*d* for display on the CLI connector seating reporting screen 806 (e.g., the CLI connector seating reporting screen 806 may need only display the "SEATED" column in the management information while omitting the "PRESENT" column). Similarly, where the connector seating detection engine 204 receives both the unseated connector signal from the seated connector sensor 308 and the connector present signal from the connector presence sensor 310, the connector seating detection engine 204 may provide only the unseated connector indication 806c for display on the CLI connector seating reporting screen 806 (e.g., the CLI connector seating reporting screen 806 may need only display the "SEATED" column in the management information while omitting the "PRESENT" column). However, while a specific example of combining connector presence and seated connector indications has been described, one of skill in the art in possession of the present disclosure will appreciate how other techniques may be used to combine connector presence and seated connector indications while remaining within the scope of the present disclosure.

Figure 9:
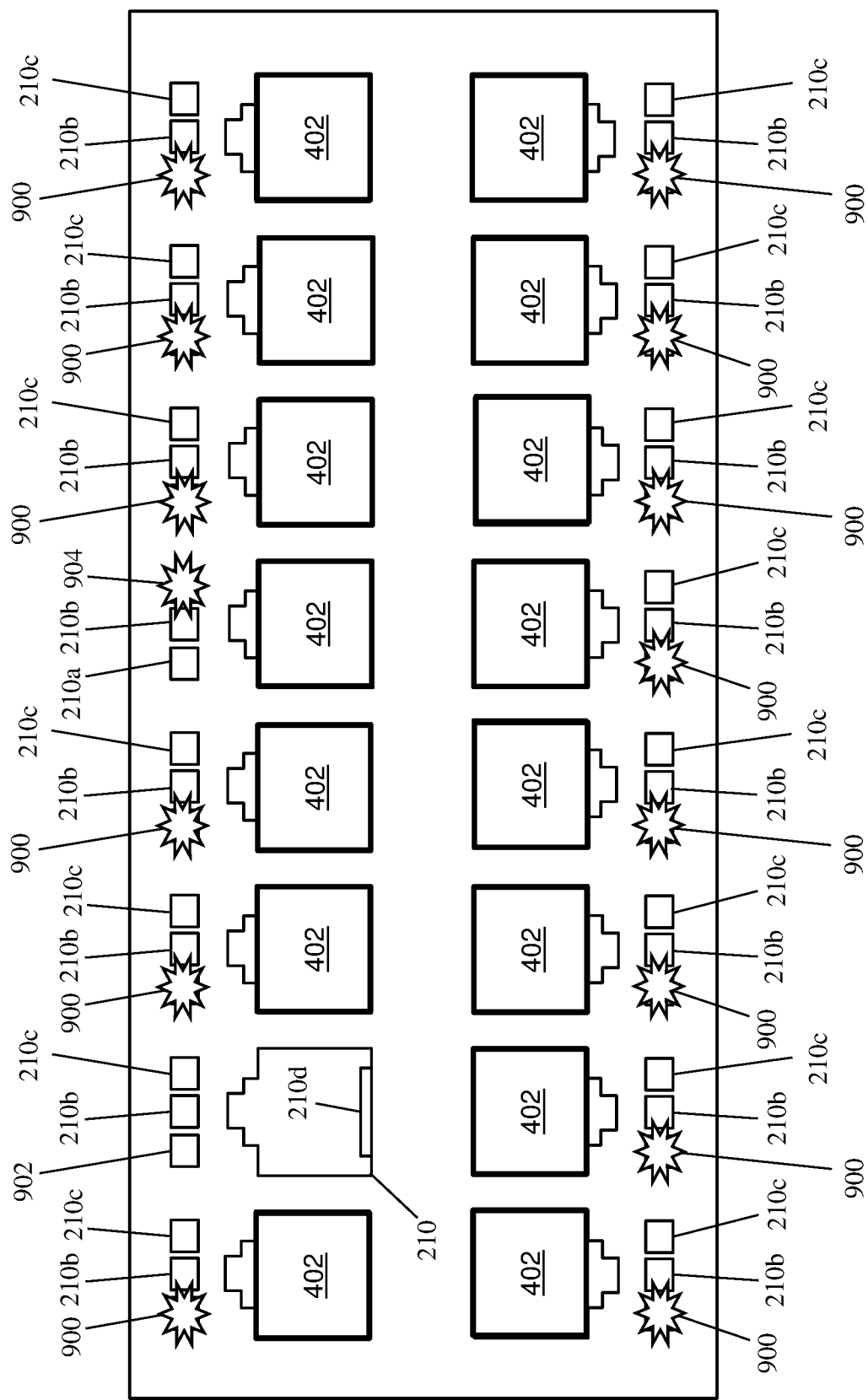
FIG. 9 is a front view illustrating an embodiment of the communication system of FIG. 2B operating during the method of FIG. 5.

As discussed above, the seated/unseated connector indications and the connector present/not present indications may be displayed using techniques other than the CLI connector seating reporting screen 806 discussed above. For example, with reference to FIG. 9, the connector seating detection engine 204 may provide the connector not present indication, the connector present indication, the unseated connector indication, and/or the seated connector indication for display using the respective indicators 210a-210c that are included in the networking device 200 in association with each of the ports 210/300. For example, in embodiments in which the connector 402 is properly seated in the port 210/300 and the connector seating detection engine 204 receives the seated connector signal from the connector seating sensor 308, the connector seating detection engine 204 may produce a seated connector indication 900 by causing the indicator 210a included in the networking device 200 to illuminate (e.g., via a conventional green "link up" light color, via a separate light color for indicating proper seating, etc.).

In another example, where the connector 402 is not coupled with the port 210/300 and the connector seating detection engine 204 receives the connector not present signal from the connector presence sensor 310, the connector seating detection engine 204 may produce a connector not present indication 902 by preventing the indicator 210a included in the networking device 200 from illuminating (e.g., via a conventional "link down" lack of illumination). However, while described is being indicated by no illumination, one of skill in the art in possession of the present disclosure will appreciate that the connector not present signal may be indicated by illuminating an indicator with a particular color light while remaining within the scope of the present disclosure as well.

In another example, where the connector 402 is improperly seated in the port 210/300 and the connector seating detection engine 204 receives the connector present signal from the connector presence sensor 310 and/or the unseated connector signal from the seated connector sensor 308, the connector seating detection engine 204 may produce an unseated connector indication 904 by causing the indicator 210c included in the networking device 200 to illuminate (e.g., via a blue "unseated connector" light color, etc.). However, while specific examples have been discussed for providing connector status indications via indicators such as LEDs, one of skill in the art in possession of the present disclosure will appreciate how other techniques for providing connector status indications may be utilized while remaining within the scope of the present disclosure.

While the embodiments discussed above describe the connector seating sensor 308 and the connector presence sensor 310 as being included on the port 300, one of skill in the art in possession of the present disclosure will appreciate how the connector seating sensor 308 and/or connector presence sensor 310 may be provided on the connector 402 and utilized similarly discussed above in order to provide the seated connector detection functionality described above. However, one of skill in the art in possession of the present disclosure will also recognize how the provisioning of the connector seating sensor 308 and/or connector presence sensor 310 on the connector 402 may introduce complexity with regard to powering the connector seating sensor 308 and/or connector presence sensor 310, communicating the seated connector signals/unseated connector signals and/or the connector present signals/connector not present signals to the connector seating detection engine 204, etc., while the provisioning of the connector seating sensor 308 and/or connector presence sensor 310 on the port 300 allows conventional cabling systems to be utilized with the seated connector detection system. However, such benefits are not meant to exclude the provisioning of the connector seating sensor 308 and/or connector presence sensor 310 on the connector 402 from falling within the scope of the present disclosure as well.

Thus, systems and methods have been described that provide a connector seating detection system that identifies if a connector is properly seated in a port. For example, the connector seating detection system of the present disclosure may include a device having a port that includes at least one port communication contact. A connector seating sensor is located adjacent to the port. A connector seating detection subsystem is coupled to the connector seating sensor. When a connector is positioned in the port while not engaging at least one port communication contact by a threshold amount, the connector seating detection subsystem receives an unseated connector signal from the connector seating sensor and, in response, generates an unseated connector indication. When a connector is position in the port while engaging at least one port communication contact the threshold amount, the connector seating detection subsystem receives a seated connector signal from the connector seating sensor and, in response, generates a seated connector indication. As such, devices having ports that include at least one port communication contact may utilize the connector seating detection system to determine the seating status of a connector in order to minimize time consuming trouble shooting connection problems, data loss, network traffic disruption, and network downtime, while eliminating the need to be physically present in order to determine whether a connector is properly seated in a port.

Although illustrative embodiments have been shown and described, a wide range of modification, change and substitution is contemplated in the foregoing disclosure and in some instances, some features of the embodiments may be employed without a corresponding use of other features. Accordingly, it is appropriate that the appended claims be construed broadly and in a manner consistent with the scope of the embodiments disclosed herein.

What is claimed is:

1. A connector seating detection system, comprising:
   a device;
   a port that is included in the device and that includes at least one port communication contact;
   a connector presence sensor that is located adjacent the port;
   a connector seating sensor that is located adjacent the port; and
   a connector seating detection subsystem that is coupled to the connector seating sensor and connector presence sensor, wherein the connector seating detection subsystem that is configured to:
receive, in response to a connector being at least partially located in the port, a connector present signal from the connector presence sensor;
receive, in response to a connector being positioned in the port while not engaging the at least one port communication contact by a threshold amount, an unseated connector signal from the connector seating sensor;
generate, in response to receiving both the connector present signal from the connector presence sensor and the unseated connector signal from the connector seating sensor, an unseated connector indication;
receive, in response to a connector being positioned in the port while engaging the at least one port communication contact by the threshold amount, a seated connector signal from the connector seating sensor; and
generate, in response to receiving the seated connector signal, a seated connector indication.

2. The system of claim 1, further comprising:
a display system that is coupled to the device and that is configured to display a Command Line Interface (CLI) screen, wherein the unseated connector indication and the seated connector indication are provided for display on the CLI screen.

3. The system of claim 1, wherein the connector seating detection subsystem is configured to:
receive, in response to a connector not being located in the port, a connector not present signal from the connector presence sensor; and
generate, in response to receiving both the unseated connector signal from the connector seating sensor and the connector not present signal from the connector presence sensor, a connector not present indication.

4. The system of claim 3, further comprising:
a display system that is coupled to the device and that is configured to display a Command Line Interface (CLI) screen, wherein the connector not present indication is provided for display on the CLI screen.

5. The system of claim 1, wherein the unseated connector indication and the seated connector indication are provided using at least one Light Emitting Device (LED).

6. The system of claim 1, wherein the connector seating sensor is a pressure sensor.

7. An Information Handling System (IHS), comprising:
a processing system; and
a memory system that is coupled to the processing system and that includes instructions that, when executed by the processing system, cause the processing system to provide a connector seating detection engine that is configured to:
receive, in response to a connector being at least partially located in a port that is coupled to the processing system, a connector present signal from a connector presence sensor;
receive, in response to a connector being positioned in the port while not engaging at least one port communication contact that is included in the port by a threshold amount, an unseated connector signal from a connector seating sensor that is located adjacent the port;
generate, in response to receiving both the connector present signal from the connector presence sensor and the unseated connector signal from the connector seating sensor, an unseated connector indication;
receive, in response to a connector being positioned in the port while engaging the at least one port communication contact by the threshold amount, a seated connector signal from the connector seating sensor; and
generate, in response to receiving the seated connector signal, a seated connector indication.

8. The IHS of claim 7, wherein the processing system is coupled to a display system, and wherein the unseated connector indication and the seated connector indication are displayed on a CLI screen that is displayed on the display system.

9. The IHS of claim 7, wherein connector seating detection engine is configured to:
receive, in response to a connector not being at least partially located in the port, a connector not present signal from the connector presence sensor; and
generate, in response to receiving both the unseated connector signal from the connector seating sensor and the connector not present signal from the connector presence sensor, a connector not present indication.

10. The IHS of claim 9, further comprising:
a display system that is coupled to the device and that is configured to display a Command Line Interface (CLI) screen, wherein the connector not present indication is provided for display on the CLI screen.

11. The IHS of claim 7, wherein the unseated connector indication and the seated connector indication are provided using at least one Light Emitting Device (LED).

12. The IHS of claim 7, wherein the connector seating sensor is a pressure sensor.

13. The IHS of claim 7, wherein the connector presence sensor is one of a pressure sensor and a light-based sensor.

14. A method for detecting the seating of a connector in a port of a device, comprising:
receiving, by a connector seating detection subsystem in response to a connector being at least partially located in a port, a connector present signal from a connector presence sensor;
receiving, by the connector seating detection subsystem in response to a connector being positioned in the port while not engaging at least one port communication contact that is included on the port by a threshold amount, an unseated connector signal from a connector seating sensor that is located adjacent the port;
generating, by the connector seating detection subsystem in response to receiving both the connector present signal from the connector presence sensor and the unseated connector signal from the connector seating sensor, an unseated connector indication;
receiving, by the connector seating detection subsystem in response to a connector being positioned in the port while engaging the at least one port communication contact by the threshold amount, a seated connector signal from the connector seating sensor; and
generating, by the connector seating detection subsystem in response to receiving the seated connector signal, a seated connector indication.

15. The method of claim 14, further comprising:
displaying, on a Command Line Interface (CLI) screen displayed on a display system, the unseated connector indication and the seated connector indication.

16. The method of claim 14, further comprising:
receiving, by the connector seating detection subsystem in response to a connector not being at least partially located in the port, a connector not present signal from the connector presence sensor; and
generating, by the connector seating detection subsystem in response to receiving both the unseated connector signal from the connector seating sensor and the connector not present signal from the connector presence sensor, a connector not present indication.

17. The method of claim 16, further comprising:
displaying, on a Command Line Interface (CLI) screen displayed on a display system, the connector not present indication.

18. The method of claim 14, wherein the unseated connector indication and the seated connector indication are provided using at least one Light Emitting Device (LED).

19. The method of claim 14, wherein the connector seating sensor is a pressure sensor.

20. The method of claim 14, wherein the connector presence sensor is one of a pressure sensor and a light-based sensor.

\* \* \* \* \*